(12) United States Patent
Takenaka

(10) Patent No.: US 12,507,342 B2
(45) Date of Patent: Dec. 23, 2025

(54) WIRING SUBSTRATE AND METHOD FOR MANUFACTURING WIRING SUBSTRATE

(71) Applicant: IBIDEN CO., LTD., Gifu (JP)

(72) Inventor: Yoshinori Takenaka, Ogaki (JP)

(73) Assignee: IBIDEN CO., LTD., Ogaki (JP)

(*) Notice: Subject to any disclaimer, the term of this patent is extended or adjusted under 35 U.S.C. 154(b) by 126 days.

(21) Appl. No.: 17/811,314

(22) Filed: Jul. 8, 2022

(65) Prior Publication Data

US 2023/0008582 A1    Jan. 12, 2023

(30) Foreign Application Priority Data

Jul. 9, 2021    (JP) .................... 2021-114223

(51) Int. Cl.
*H05K 1/18*    (2006.01)
*H05K 1/02*    (2006.01)

(52) U.S. Cl.
CPC ........... *H05K 1/0298* (2013.01); *H05K 1/186* (2013.01); *H05K 2201/0209* (2013.01); *H05K 2201/0212* (2013.01); *H05K 2201/09036* (2013.01); *H05K 2201/10977* (2013.01)

(58) Field of Classification Search
CPC . H05K 2201/09036; H05K 2201/0209; H05K 1/0298; H05K 1/186; H05K 2201/0212; H05K 2201/10977; H05K 3/4602
See application file for complete search history.

(56) References Cited

U.S. PATENT DOCUMENTS

| | | | |
|---|---|---|---|
| 2007/0082183 A1* | 4/2007 | Murai | H05K 3/421 |
| | | | 428/209 |
| 2008/0052905 A1* | 3/2008 | Watanabe | H05K 3/4658 |
| | | | 29/830 |
| 2011/0139494 A1* | 6/2011 | Yu | H05K 3/107 |
| | | | 174/255 |
| 2013/0235545 A1* | 9/2013 | Ohmi | H05K 1/0237 |
| | | | 361/783 |
| 2016/0007460 A1* | 1/2016 | Shimizu | H05K 1/112 |
| | | | 361/783 |
| 2017/0290149 A1* | 10/2017 | Nakamura | B32B 27/10 |
| 2018/0054885 A1* | 2/2018 | Takenaka | H05K 1/0213 |
| 2022/0201853 A1* | 6/2022 | Chu | H05K 1/0298 |
| 2024/0057253 A1* | 2/2024 | Lee | H05K 1/0373 |

FOREIGN PATENT DOCUMENTS

JP    2010-040625 A    2/2010

* cited by examiner

*Primary Examiner* — Steven T Sawyer
(74) *Attorney, Agent, or Firm* — Finnegan, Henderson, Farabow, Garrett & Dunner, LLP

(57) ABSTRACT

A wiring substrate includes an insulating layer including resin and filler particles, and an embedded wiring layer including wirings and embedded in the insulating layer such that the wirings are filling grooves formed on a surface of the insulating layer, respectively. The embedded wiring layer is formed such that the inter-wiring distance between the closest two wirings of the wirings in the embedded wiring layer is in the range of 2 μm to 8 μm, and the insulating layer is formed such that the maximum particle size of the filler particles is 50% or less of the inter-wiring distance.

20 Claims, 5 Drawing Sheets

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2021-114223, filed Jul. 9, 2021, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2010-40625 describes a wiring substrate having a wiring layer having fine patterns. The entire contents of this publication are incorporated herein by reference.

SUMMARY OF THE INVENTION

According to one aspect of the present invention, a wiring substrate includes an insulating layer including resin and filler particles, and an embedded wiring layer including wirings and embedded in the insulating layer such that the wirings are filling grooves formed on a surface of the insulating layer, respectively. The embedded wiring layer is formed such that the inter-wiring distance between the closest two wirings of the wirings in the embedded wiring layer is in the range of 2 µm to 8 µm, and the insulating layer is formed such that the maximum particle size of the filler particles is 50% or less of the inter-wiring distance.

According to another aspect of the present invention, a method for manufacturing a wiring substrate includes forming an insulating layer including resin and filler particles, and forming an embedded wiring layer including wirings in the insulating layer such that the embedded wiring layer is embedded in the insulating layer and that the wirings are filling grooves formed on a surface of the insulating layer, respectively. The forming of the embedded wiring layer includes forming the grooves in the insulating layer such that the inter-wiring distance between the closest two grooves of the grooves is set in the range of 2 µm to 8 µm, forming a metal film layer covering the inner surfaces of the grooves, and forming a plating film layer on the metal film layer, and the forming of the insulating layer includes setting the maximum particle size of the filler particles to 50% or less of the inter-wiring distance between the closest two grooves of the grooves.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
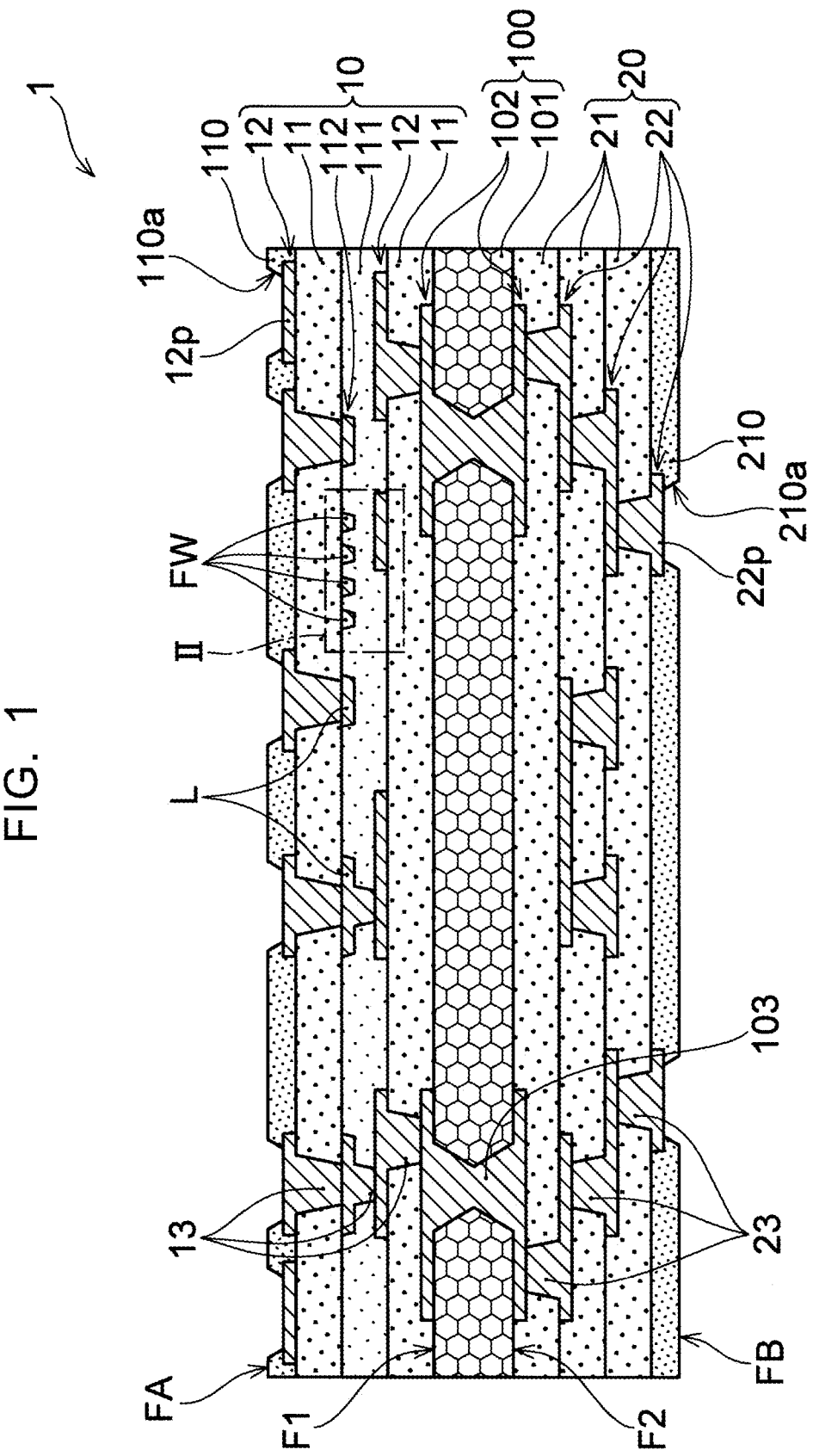
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

A wiring substrate according to an embodiment of the present invention is described with reference to the drawings. The drawings to be referred to below are drawn such that features according to an embodiment of the present invention can be easily understood, without intending to show exact proportions of structural elements. FIG. 1 illustrates a cross-sectional view of a wiring substrate 1 as an example of a structure that the wiring substrate of the embodiment can have.

As illustrated in FIG. 1, the wiring substrate 1 includes a core substrate 100 that includes an insulating layer (core insulating layer) 101 and conductor layers (core conductor layers) 102 formed on both sides of the core insulating layer 101. On each of both sides of the core substrate 100, insulating layers and conductor layers are alternately laminated. In the illustrated example, a first build-up part 10 in which insulating layers (11, 111) and conductor layers (12, 112) are laminated is formed on one surface (F1) of the core substrate 100. Further, a second build-up part 20 in which insulating layers 21 and conductor layers 22 are laminated is formed on the other surface (F2) of the core substrate 100.

In the description of the wiring substrate of the present embodiment, a side farther from the core insulating layer 101 is referred to as "upper," "upper side," "outer side," or "outer," and a side closer to the core insulating layer 101 is referred to as "lower," "lower side," "inner side," or "inner." Further, for the conductor layers and the insulating layers, a surface facing the opposite side with respect to the core substrate 100 is also referred to as an "upper surface," and a surface facing the core substrate 100 side is also referred to as a "lower surface." Therefore, for example, in the description of the structural elements of the first build-up part 10 and the second build-up part 20, a side farther from the core substrate 100 is also referred to as an "upper side," "upper-layer side," or "outer side," or simply "upper" or "outer," and a side closer to the core substrate 100 is also referred to as a "lower side," "lower-layer side," or "inner side," or simply "lower" or "inner."

A solder resist layer 110 is formed on the first build-up part 10. A solder resist layer 210 is formed on the second build-up part 20. Openings (110a) are formed in the solder resist layer 110, and conductor pads (12p) of the outermost conductor layer 12 in the first build-up part 10 are exposed from the openings (110a). Openings (210a) are formed in the solder resist layer 210, and conductor pads (22p) of the outermost conductor layer 22 in the second build-up part 20 are exposed from the openings (210a).

An outermost surface of the first build-up part 10 formed by exposed surfaces of the conductor layer 12 (the conductor pads (12p)) and the solder resist layer 110 is referred to as a first surface (FA). An outermost surface of the second build-up part 20 formed by exposed surfaces of the solder resist layer 210 and the conductor layer 22 (the conductor pads (22p)) is referred to as a second surface (FB). That is, the wiring substrate 1 has the first surface (FA) and the second surface (FB) on the opposite side with respect to the first surface (FA) as two surfaces that extend in a direction orthogonal to a thickness direction of the wiring substrate 1.

In the insulating layer 101 of the core substrate 100, through-hole conductors 103 are formed connecting the conductor layer 102 that forms the one surface (F1) of the core substrate 100 and the conductor layer 102 that forms the other surface (F2) in the core substrate 100. In the insulating layers (11, 111, 21), via conductors (13, 23) connecting the conductor layers sandwiching the insulating layers (11, 111, 21) are formed.

The conductor layers (102, 12, 112, 22), the via conductors (13, 23), and the through-hole conductors 103 are formed using any metal such as copper or nickel, and, for example, are each formed of a metal foil such as a copper foil and/or a metal film formed by plating or sputtering. The conductor layers (102, 12, 112, 22), the via conductors (13, 23), and the through-hole conductors 103 are each illustrated in FIG. 1 as having a single-layer structure, but each may have a multilayer structure that includes two or more metal layers. For example, the conductor layers 102 that are respectively formed on the surfaces of insulating layer 101 each may have a three-layer structure including a metal foil, an electroless plating film, and an electrolytic plating film. Further, the conductor layers (12, 112, 22), the via conductors (13, 23), and the through-hole conductors 103 each may have, for example, a two-layer structure including an electroless plating film and an electrolytic plating film.

Each of the conductor layers (102, 12, 112, 22) of the wiring substrate 1 is patterned to have predetermined conductor patterns. In particular, in the illustrated example, as will be described in detail later, the conductor layer 112 is formed as an embedded wiring layer having a form of being embedded inward from an outer surface of the insulating layer 111 and is formed to have wirings (FW) formed in relatively fine patterns. Further, the outermost conductor layer 12 of the first build-up part 10 is formed to have patterns including the conductor pads (12p). The conductor pads (12p) are formed such that a component (not illustrated in the drawings) to be mounted on the wiring substrate 1 when the wiring substrate 1 is used can be placed. That is, the conductor pads (12p) are component mounting pads to be used as connecting parts when an external component is mounted on the wiring substrate 1, and the first surface (FA) of the wiring substrate 1 may be a component mounting surface on which a component can be mounted. Electrodes of an electronic component can be electrically and mechanically connected to the component mounting pads (conductor pads) (12p), for example, via a bonding material (not illustrated in the drawings) such as solder. Examples of components that can be mounted on the wiring substrate 1 include electronic components such as active components such as semiconductor integrated circuit devices and transistors.

The second surface (FB), which is a surface on the opposite side with respect to the first surface (FA) of the wiring substrate 1 in the example of FIG. 1, can be a connection surface that is connected to an external wiring substrate, for example, an external element such as a motherboard of any electrical device when the wiring substrate 1 itself is mounted on the external element. Further, similarly to the first surface (FA), the second surface (FB) may be a component mounting surface on which an electronic component such as a semiconductor integrated circuit device is mounted. Without being limited to these, the conductor pads (22p) forming the second surface (FB) can be connected to any substrate, electrical component, mechanism element, or the like.

Each of the insulating layers (101, 11, 111, 21) is formed, for example, using an insulating resin such as an epoxy resin, a bismaleimide triazine resin (BT resin) or a phenol resin. Each of the insulating layers may contain a reinforcing material (core material) such as a glass fiber and/or inorganic filler such as silica or alumina. In particular, in the illustrated example, as will be described in detail later, dimensions of filler particles contained in the insulating layer 111, in which the conductor layer 112 is embedded as an embedded wiring layer, have predetermined values that are limited in relation to an inter-line distance of the wirings (FW) in the conductor layer 112. Each of the solder resist layers (110, 210) is formed using, for example, a photosensitive epoxy resin or polyimide resin, or the like.

The wiring substrate of the embodiment has at least one conductor layer in a form of an embedded wiring layer that includes fine wiring patterns having relatively small line width and inter-line distance. Specifically, in the illustrated wiring substrate 1, the conductor layer 112 forming the first build-up part 10 is an embedded wiring layer in a form of being embedded in the insulating layer 111 from an outer side, and has the wirings (FW) formed in relatively fine patterns. In addition, in the illustrated example, the embedded wiring layer (conductor layer) 112 includes, in addition to the wirings (FW), land parts (L) that can be connected to the upper-side conductor layer 12 via via conductors 13.

The wirings (FW) are formed as wiring patterns having relatively small line widths and inter-line distances. The wirings (FW) are illustrated in the cross-sectional view of FIG. 1 as multiple (4 in the illustrated example) wirings extending in parallel along a direction perpendicular to the paper (that is, from a front side to a back side of the paper), and are also referred to as fine wirings (FW). Specifically, as will be described later with reference to FIG. 2, a maximum particle size of the multiple filler particles contained in the insulating layer 111 in which the embedded wiring layer 112 is embedded has a value of a predetermined ratio or less with respect to an inter-line distance of the fine wirings (FW). As a result, it may be possible that a defect such as a short circuit in the embedded wiring layer 112 is suppressed.

In the wiring substrate 1 of the illustrated example, among the conductor layers forming the first build-up part 10, the conductor layer 112 on the one-layer inner side of the outermost conductor layer 12 is formed as an embedded wiring layer. However, it is also possible that multiple conductor layers of such a form are formed in the wiring substrate. For example, in second build-up part 20, the conductor layer 22 of the same rank as the conductor layer 112 in the first build-up part 10 may be formed as an embedded wiring layer, and the insulating layer 21 of the same rank as the insulating layer 111 may be formed to have the same filler dimensions and filler content rate as the insulating layer 111. The term "rank" is a number assigned to each of the conductor layers (12, 112, 22) when the number that increases by 1 for each layer starting from the core substrate 100 side is sequentially assigned starting from 1 to each of the multiple conductor layers (12, 112, 22) laminated in each of the first build-up part 10 and the second build-up part 20. Due to that the same insulating layer and embedded wiring layer as those in the first build-up part 10 are formed in the second build-up part 20 at the same ranks as those in the first build-up part 10, it may be possible that the symmetry of the wiring substrate in the thickness direction is improved and warpage of the wiring substrate is suppressed.

Figure 2:
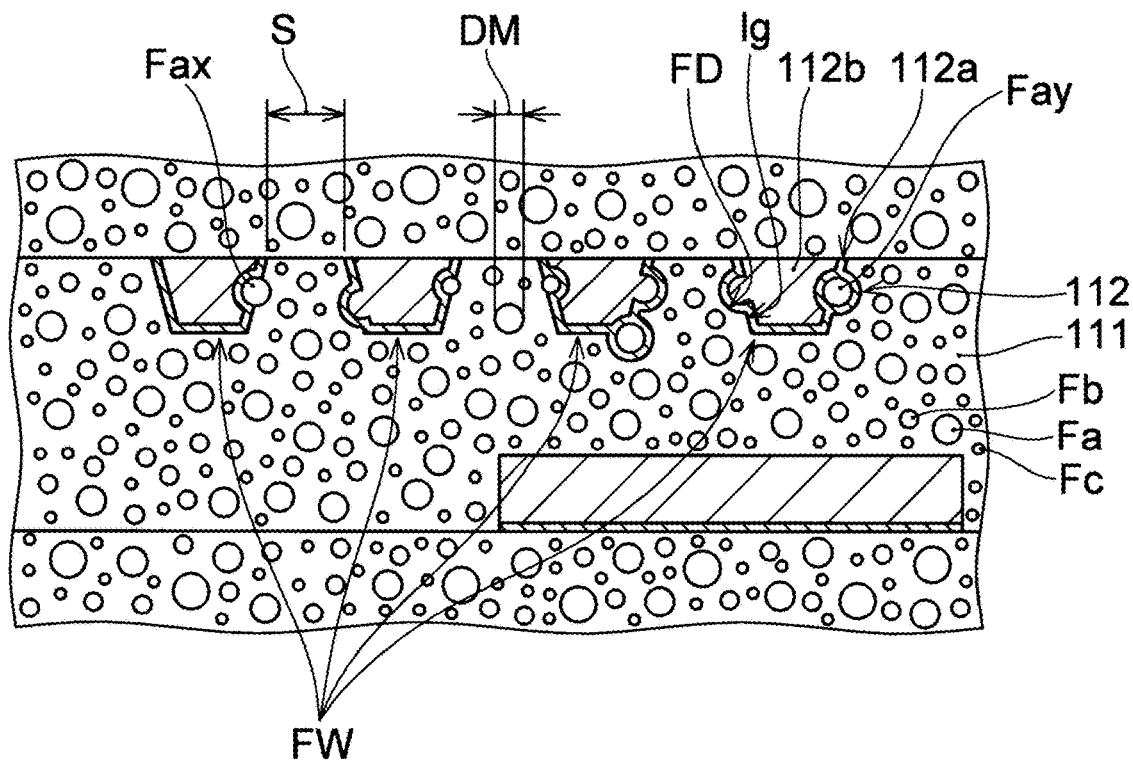
FIG. 2 is an enlarged view of a portion (II) in FIG. 1, which is an example of a wiring substrate according to an embodiment of the present invention.

Next, with reference to FIG. 2, a relationship between dimensions of the fine wirings (FW) in the embedded wiring layer 112 embedded in the insulating layer 111 and dimensions of the multiple filler particles contained in the insulating layer 111 is described in detail. FIG. 2 is an enlarged view of a region surrounded by a one-dot chain line indicated with a reference numeral symbol "II" in the cross-sectional view of FIG. 1. The fine wirings included in the embedded wiring layer in the wiring substrate of the embodiment has a closest inter-wiring distance (S) of 2 μm or more and 8 μm or less in the wiring patterns. In the illustrated example, the conductor layer 112 is formed to have a two-layer structure including a metal film layer (electroless plating film layer) (112a) and an electrolytic plating film layer (112b). The metal film layer (112a) covers inner surfaces of grooves (1g) formed in the insulating layer 111, and inner side of the metal film layer (112a) in the grooves (1g) is filled with the electrolytic plating film layer (112b).

The insulating layer 111 contains multiple granular filler particles (Fa, Fb, Fc). As illustrated in the drawings, the multiple granular filler particles (Fa, Fb, Fc) contained in the insulating layer 111 may have different particle sizes. Examples of these filler particles include particles of inorganic substances such as silicon oxide, alumina, or mullite. It is also possible that the filler particles are organic particles such as polyimide particles. The term "particle size" in the description of filler particles is a linear distance between two most distant points on an outer surface of a filler particle.

As described in detail in the description of a manufacturing method to be described later, the grooves (1g) formed in the insulating layer 111 may be formed by perforation by laser irradiation from above the insulating layer 111, and a subsequent desmear treatment using a chemical solution. At the stage of perforation with laser, it may be possible that filler particles are exposed on inner wall surfaces of the grooves (1g). Therefore, for example, as illustrated in the leftmost wiring (FW) among the four illustrated wirings (FW), it may be possible that the metal film (112a) covering the inner wall surface of the groove (1g) is formed following a shape of an exposed filler particle (Fax) and a distortion in a shape of the wiring (FW) occurs.

Further, at the stage of the desmear treatment, it may be possible that, due to infiltration of the chemical solution into an interface between a filler particle exposed on an inner side of a groove (1g) and the resin surrounding the filler particle, peeling occurs between the filler particle and the resin. Therefore, for example, as illustrated in the rightmost wiring (FW) among the four illustrated wirings (FW), it may be possible that the metal film (112a) is formed entering an interface between a filler particle (Fay) and the resin. Further, it may be possible that, due to peeling between a filler particle and the resin that can occur at the stage of the desmear treatment, the filler particle falls off from the resin. Therefore, for example, as illustrated in the rightmost wiring (FW) among the four illustrated wirings (FW), it may be possible that a recess (FD) corresponding to a shape of a filler particle is formed on the inner wall surface of the groove (1g) and the metal film (112a) is formed along a shape of the recess (FD). Therefore, it may be possible that, due to the peeling and falling off of these filler particles from the resin, a distance between adjacent conductor patterns in the embedded wiring layer 112 is partially reduced. Specifically, there is a risk that a distance between the fine wirings (FW) may be reduced, leading to a short circuit between the wirings (FW).

In the wiring substrate of the present embodiment, particle sizes of filler particles contained in an insulating layer in which a wiring layer having the form of the embedded wiring layer is embedded are limited in a maximum value thereof in relation to dimensions of wirings contained in the embedded wiring layer. Specifically, in the multiple filler particles (Fa, Fb, Fc) contained in insulating layer 111 in the wiring substrate 1, a particle size (DM) of the largest filler particle (Fa) is 50% or less of the inter-wiring distance (S) of the wirings (FW).

More specifically, when the wirings (FW) are formed to have a (line/space) (L/S) of, for example, (5 μm)/(5 μm), the maximum particle size of the multiple filler particles contained in the insulating layer 111 is 2.5 μm or less, and preferably can be, for example, By having such a relationship between the inter-wiring distance (S) of the fine wirings (FW) in the embedded wiring layer 112 and the maximum particle size (DM) of the filler particles contained in the insulating layer 111, a short circuit between the fine wirings (FW) can be suppressed. Even when the above-described partial proximity of the wirings (FW) due to peeling and falling off of filler particles exposed on the inner wall surfaces of the grooves (1g) from the resin occurs, a degree of the proximity can be suppressed. Therefore, a possibility that a short circuit occurs between the wirings (FW) can be reduced.

Figure 3:
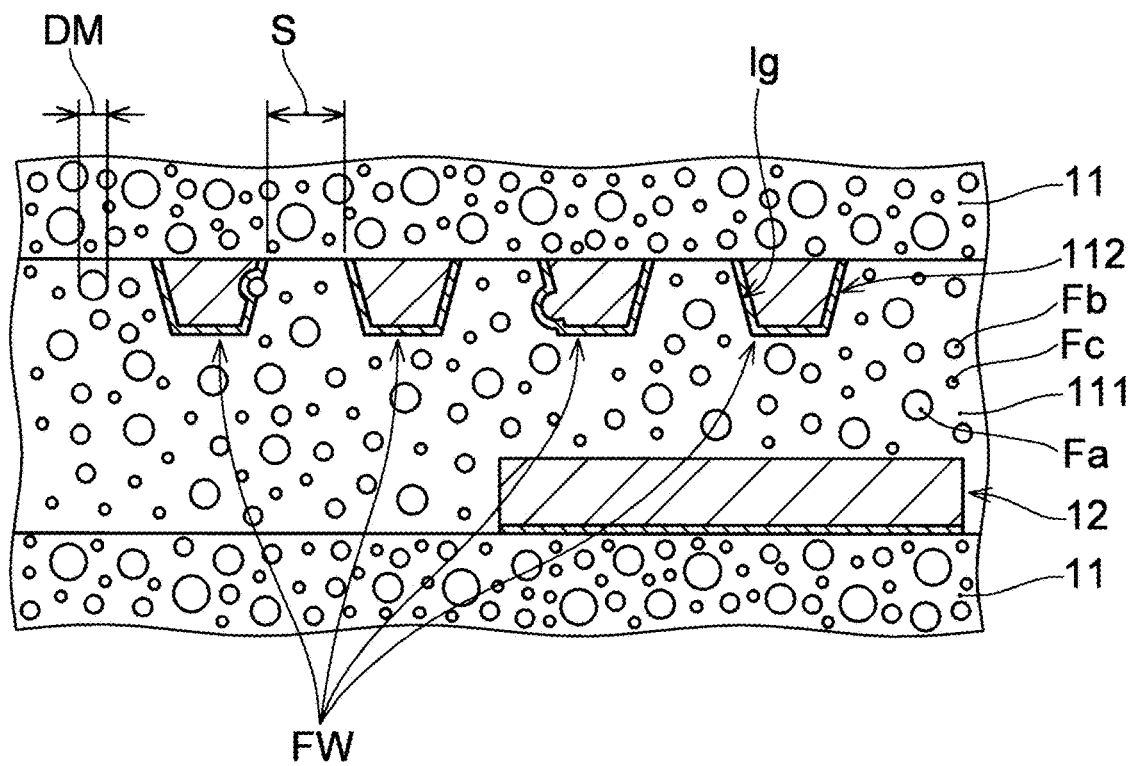
FIG. 3 is a partially enlarged view corresponding to FIG. 2 in another example of a wiring substrate according to an embodiment of the present invention.

In addition to limiting the maximum particle size (DM) of the multiple filler particles (Fa, Fb, Fc) contained in insulating layer 111 to a predetermined value or less as described above, as illustrated in FIG. 3, by reducing a filler content rate of the insulating layer 111, the possibility that a short circuit occurs between the wirings (FW) can be further reduced. For example, the insulating layer 111 may have a lower filler content rate than the insulating layer 11 in which the conductor layer 112 in the form of an embedded wiring layer in the wiring substrate 1 is not embedded. The filler content rate of the insulating layer 111 may be set to, for example, 25 weight % or more and 70 weight % or less. A possibility that filler particles are exposed in the grooves (1g) can be reduced while properties (for example, thermal properties such as a thermal expansion coefficient and a thermal conductivity, mechanical properties such as an elastic modulus and a flexibility, and/or dielectric properties such as a relative permittivity and a dielectric loss tangent) required for the insulating layer 111 can be satisfied. Therefore, the risk of a short circuit in the embedded wiring layer 112 can be further reduced. Further, similarly, from a point of view of suppressing a short circuit, a ratio of filler particles (Fa) having particle sizes of 25% or more of the inter-wiring distance (S) to the multiple filler particles (Fa, Fb, Fc) contained in the insulating layer 111 is more desirably 75% or less.

Further, in the illustrated example, the conductor layer 12 is formed on the opposite side with respect to the embedded wiring layer 112 in the thickness direction of the insulating layer 111. When the grooves (1g) are relatively deep in the thickness direction of the insulating layer 111 and the embedded wiring layer 112 and the conductor layer 12 are relatively close to each other, due to the peeling and falling off of the filler particles from the resin described above, it is also possible that the embedded wiring layer 112 and the conductor layer 12 are partially close to each other and a short circuit occurs. Therefore, as described above, the maximum particle size (DM) of the filler particles contained in the insulating layer 111 may be 50% or less of the inter-wiring distance (S) and 25% or less of a closest distance between the conductor layer 12 and the embedded wiring layer 112.

It may be possible that the fine wirings (FW) are signal-transmission wirings, and the signals can be high frequency signals. Therefore, the insulating layer 111 in which the conductor layer 112 is embedded preferably has excellent high frequency characteristics. When an insulating layer in contact with a wiring has relatively high permittivity and dielectric loss tangent, a dielectric loss (transmission loss) of a high frequency signal transmitted via the wiring is relatively large. The dielectric loss tends to be large when the frequency of the signal is high. In particular, when a high frequency signal in the microwave or millimeter wave region is transmitted, the dielectric loss can be significantly large. Therefore, for the insulating layer 111 in which the conductor layer 112 is embedded, a material having relatively small permittivity and dielectric loss tangent is preferably used, and, for example, at a frequency of 1 GHz, a relative permittivity is preferably 3.5 or less and a dielectric loss tangent is preferably 0.005 or less.

Regarding the relative permittivity and the dielectric loss tangent of an insulating layer described above, it is more preferable that the insulating layer 11 directly above the conductor layer 112 similarly has a relative permittivity of 3.5 or less and a dielectric loss tangent of 0.005 or less at a frequency of 1 GHz. Since all the insulating layers in contact with the conductor layer 112 have excellent high frequency characteristics, the conductor layer 112 can have even more excellent signal transmission quality. Therefore, a material having relatively small permittivity and dielectric loss tangent is preferably used for the filler particles contained in the insulating layer 111 and the insulating layer 11 that are in contact with the embedded wiring layer 112. For example, filler particles containing silicon oxide or boron nitride can be preferably used.

Figure 4A:
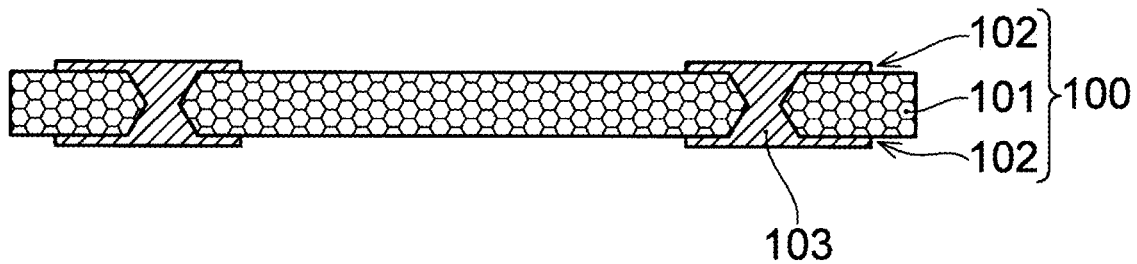
FIG. 4A is a cross-sectional view illustrating a method for manufacturing a wiring substrate according to an embodiment of the present invention.

With reference to FIGS. 4A-4H, a manufacturing method is described using a case where the wiring substrate 1 illustrated in FIG. 1 is manufactured as an example. First, as illustrated in FIG. 4A, the core substrate 100 is prepared. In the preparation of the core substrate 100, for example, a double-sided copper-clad laminated plate containing the core insulating layer 101 is prepared. Then, the core substrate 100 is prepared by using a subtractive method or the like to form the conductor layers 102 including predetermined conductor patterns on both sides of the insulating layer 101 and form the through-hole conductors 103 in the insulating layer 101.

Figure 4B:
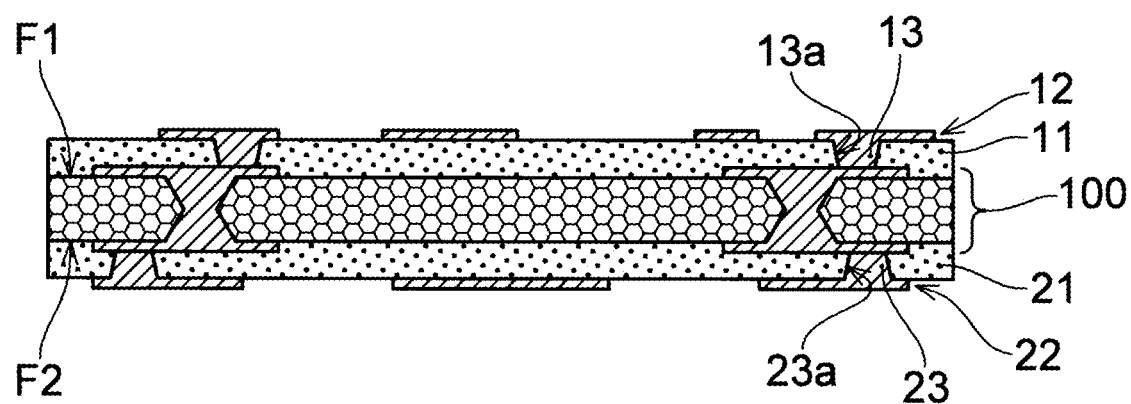
FIG. 4B is a cross-sectional view illustrating a method for manufacturing a wiring substrate according to an embodiment of the present invention.
Figure 4C:
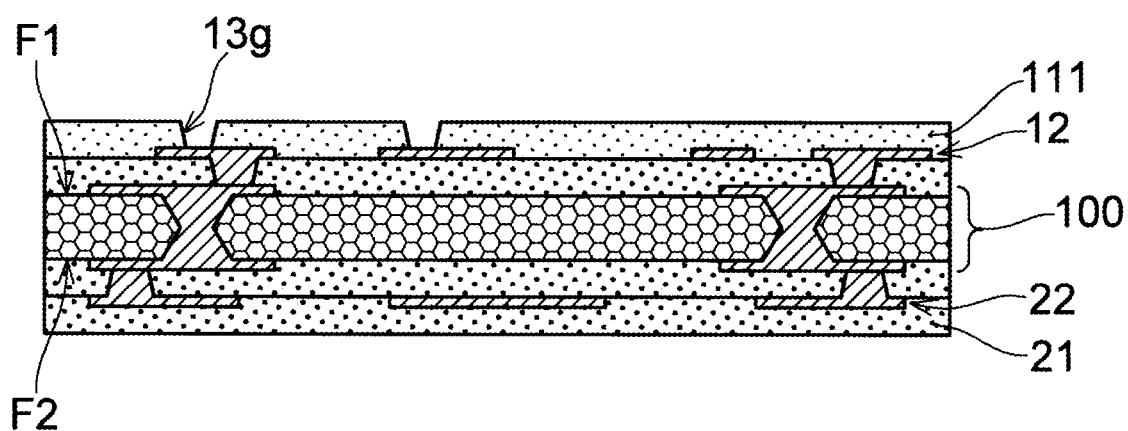
FIG. 4C is a cross-sectional view illustrating a method for manufacturing a wiring substrate according to an embodiment of the present invention.

Next, as illustrated in FIG. 4B, the insulating layer 11 is formed on the one surface (F1) of the core substrate 100, and the conductor layer 12 is laminated on the insulating layer 11. The insulating layer 21 is formed on the other surface (F2) of the core substrate 100, and the conductor layer 22 is laminated on the insulating layer 21. For example, each of the insulating layers (11, 21) is formed by thermocompression bonding a film-like insulating resin onto the core substrate 100. The conductor layers (12, 22) are formed using any method for forming conductor patterns, such as a semi-additive method, at the same time as the via conductors (13, 23) filling openings (13a, 23a) that can be formed in the insulating layers (11, 21), for example, using laser.

Next, as illustrated in 4C, the insulating layer 111 is laminated on the one surface (F1) side of the core substrate 100, and the insulating layer 21 is laminated on the conductor layer 22 on the other surface (F2) side. Through holes (13g) are formed in the insulating layer 111 by laser processing. The through holes (13g) are formed at positions where the via conductors 13 (see FIG. 1) that penetrate the insulating layer 111 are to be formed. Carbon dioxide laser of a relatively long wavelength of about 10 μm may be used in the formation of the through holes (13g).

For the formation of the insulating layer 111, a film-like resin containing multiple granular filler particles having a maximum particle size of 50% or less of a shortest distance between the grooves (1g) for the wirings to be subsequently described with reference to FIG. 4D may be used. Preferably, a filler content rate of the film-like resin forming the insulating layer 111 is 25 weight % or more and 70 weight % or less. After the insulating layer 111 and the insulating layer 21 are laminated and before the through holes (13g) are formed, on the other surface (F2) side of the core substrate 100, the exposed surface of the insulating layer 21 can be appropriately protected using a mask such as a PET film.

Figure 4D:
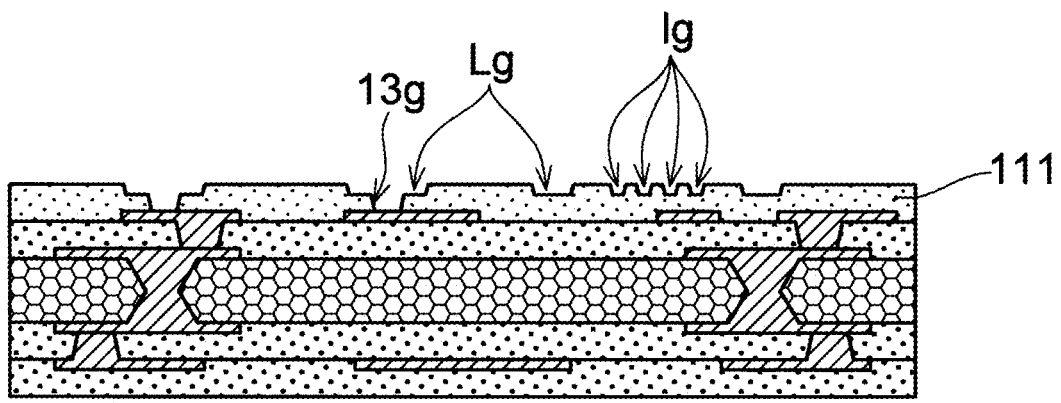
FIG. 4D is a cross-sectional view illustrating a method for manufacturing a wiring substrate according to an embodiment of the present invention.

Next, as illustrated in FIG. 4D, for example, grooves (Lg, 1g) are formed by processing using excimer laser or the like having a relatively short wavelength and relatively excellent straightness in processing of an insulating layer. The grooves (Lg, 1g) are formed according to wiring patterns that are to be provided in a conductor layer of a form of an embedded wiring layer to be embedded in the insulating layer 111. The grooves (Lg) correspond to land parts in the embedded wiring layer 112 to be formed, and the grooves (1g) correspond to the fine wirings in the embedded wiring layer. The grooves (1g) are formed such that a shortest distance between the grooves (1g) is 2 μm or more and 8 μm or less. The order of the formation of the through holes (13g) and the grooves (Lg, 1g) described with reference to FIGS. 4C and 4D can be arbitrarily changed. For example, the grooves (Lg, 1g) may be formed prior to the formation of through holes (13g).

Figure 4E:
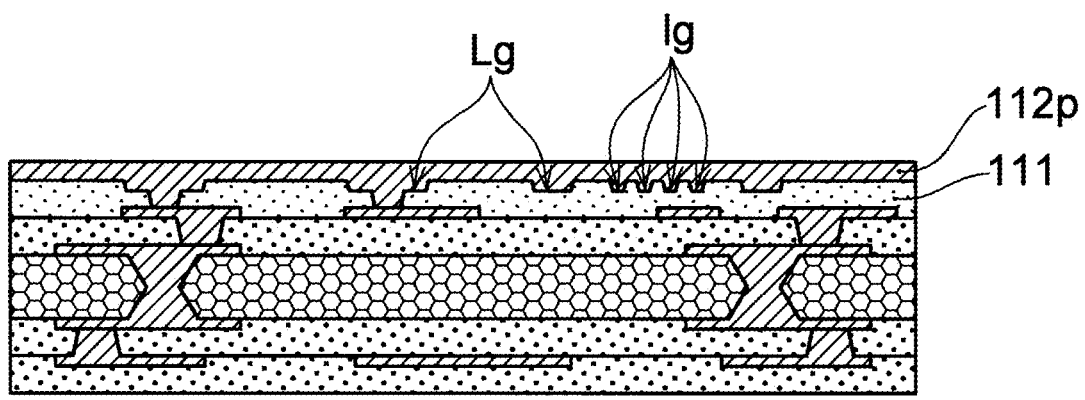
FIG. 4E is a cross-sectional view illustrating a method for manufacturing a wiring substrate according to an embodiment of the present invention.

Next, as illustrated in FIG. 4E, a conductor layer (112p) is formed so as to cover the entire upper surface of the insulating layer 111 (including inner surfaces of the through holes (13g), inner surfaces of the grooves (Lg, 1g), and the upper surface of the insulating layer 111). For example, a metal film layer is formed on the entire upper surface of the insulating layer 111 by electroless plating or sputtering. The metal film layer entirely covers the inner surfaces of the through holes (13g) and the grooves (Lg, 1g) and the upper surface of the insulating layer 111. Next, electrolytic plating is performed using this metal film layer as a seed layer to form a plating film layer, and thereby, inner side of the metal film layer of the through holes (13g) and the grooves (Lg, 1g) is filled with conductors and the conductor layer (112p) covering the entire upper surface of the insulating layer 111 is formed.

Figure 4F:
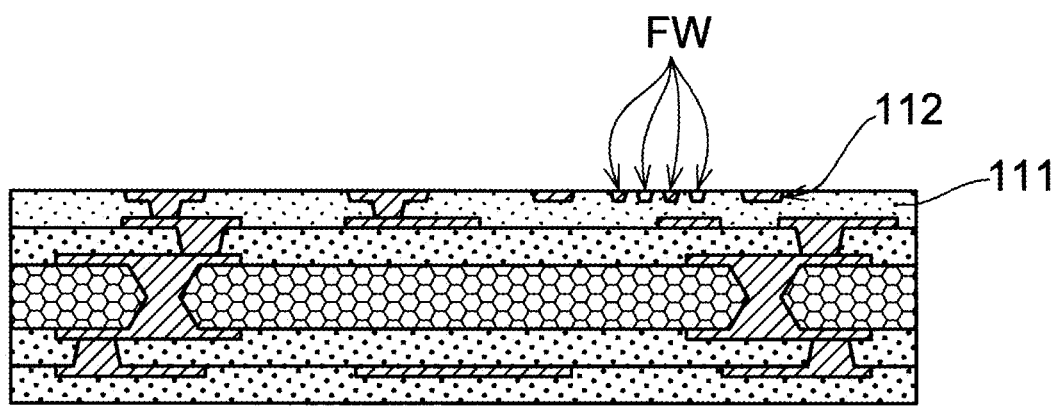
FIG. 4F is a cross-sectional view illustrating a method for manufacturing a wiring substrate according to an embodiment of the present invention.

Next, as illustrated in FIG. 4F, a portion of the conductor layer (112p) above the upper surface of the insulating layer 111 in the thickness direction is removed by polishing. The insulating layer 111 is exposed, and the formation of the embedded wiring layer 112 having the fine wirings (FW) is completed. The polishing of the conductor layer (112p) may be performed, for example, by chemical mechanical polishing (CMP).

Figure 4G:
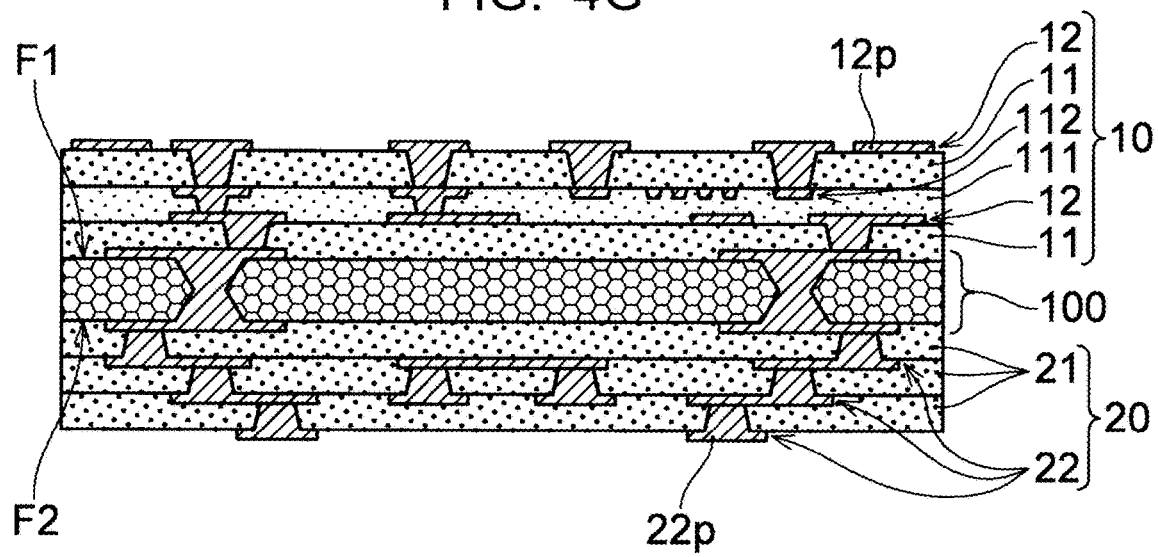
FIG. 4G is a cross-sectional view illustrating a method for manufacturing a wiring substrate according to an embodiment of the present invention.

Next, as illustrated in FIG. 4G, on the other surface (F2) side of the core substrate 100, the conductor layer 22 is integrally formed with the via conductors 23. Subsequent, on the one surface (F1) side of the core substrate 100, using the same method as the formation of the insulating layer 11 and the conductor layer 12 on the core substrate 100 described above, the insulating layer 11 and the conductor layer 12 are formed on the upper side of the conductor layer 112. The formation of the build-up layer 10 on the one surface (F1) side of the core substrate 100 is completed. On the other surface (F2) side of the core substrate 100, one insulating layer 21 and conductor layers 22 are alternately laminated. The formation of the second build-up part 20 on the other surface (F2) side is complete. The outermost conductor layer 12 of the first build-up part 10 is formed to have patterns including the conductor pads (12p), and the outermost conductor layer 22 of the second build-up part 20 is formed to have patterns including the conductor pads (22p).

Figure 4H:
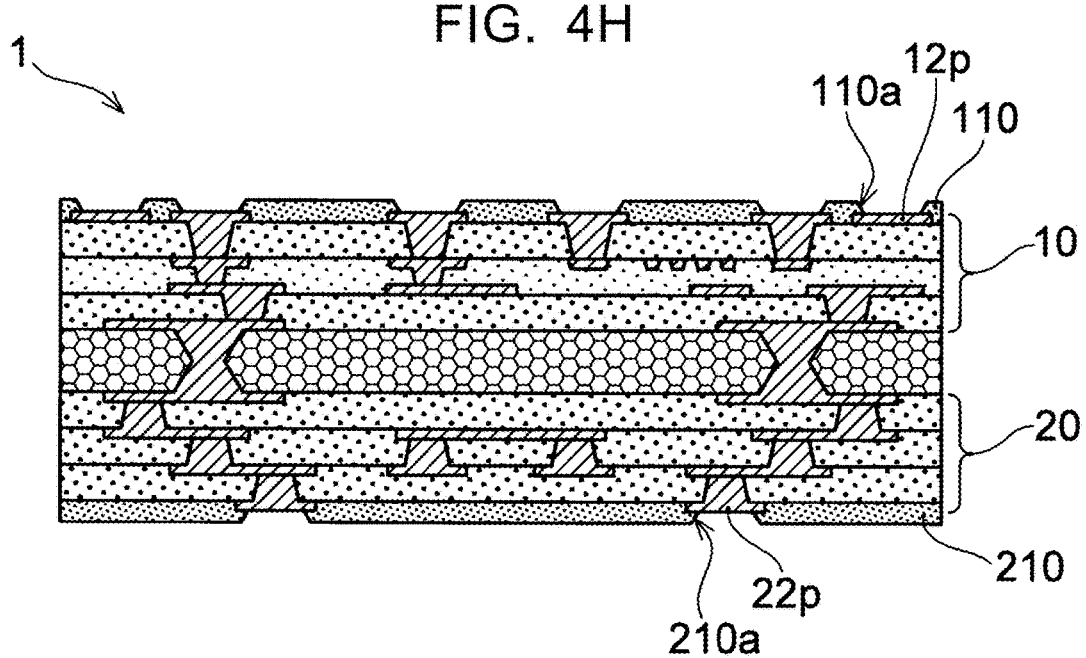
FIG. 4H is a cross-sectional view illustrating a method for manufacturing a wiring substrate according to an embodiment of the present invention.

Next, as illustrated in FIG. 4H, the solder resist layer 110 is formed on the first build-up part 10, and the solder resist layer 210 is formed on the second build-up part 20. For example, photosensitive epoxy resin films are formed by spray coating, curtain coating, or film pasting, and the openings (110a, 210a) are formed by exposure and development. The conductor pads (12p, 22p) are exposed from the openings (110a, 210a) of the solder resist layers (110, 210).

By the above processes, the formation of the wiring substrate 1 is completed. A protective film (not illustrated in the drawings) may be formed on the exposed surface of each of the conductor pads (12p, 22p). For example, the protective film formed of Ni/Au, Ni/Pd/Au, Sn or the like may be formed by plating. An OSP film may be formed by spraying an organic material.

A wiring substrate according to an embodiment of the present invention is not limited to those having the structures illustrated in the drawings and those having the structures, shapes, and materials exemplified herein. For example, one or more conductor layers each having a form of an embedded wiring layer having fine wirings may be provided among the conductor layers forming the wiring substrate. In the description of the embodiment, an example is illustrated in which fine wirings having the same depth (thickness) are provided in one embedded wiring layer. However, multiple wirings having different thicknesses may be formed in the same embedded wiring layer. Each of the first build-up part and the second build-up part may include any number of insulating layers and any number of conductor layers. The number of insulating layers and conductor layers of the first build-up part and the number of insulating layers and conductor layers of the second build-up part formed on both sides of the core substrate may be different from each other.

A method for manufacturing a wiring substrate according to an embodiment of the present invention is not limited to the method described with reference to the drawings. Conditions, processing orders and the like of the method may be appropriately modified. Depending on a structure of an actually manufactured wiring substrate, some of the processes may be omitted, or other processes may be added.

Japanese Patent Application Laid-Open Publication No. 2010-40625 describes a wiring substrate having a wiring layer having fine patterns. By forming grooves with laser in a resin layer formed of, for example, an epoxy resin that forms an interlayer insulating layer, and filling the grooves with a conductor, fine wiring patterns having a form of being embedded in the resin layer are formed.

It is thought that the wiring layer having fine patterns formed in the wiring substrate described in Japanese Patent Application Laid-Open Publication No. 2010-40625 has a relatively small inter-wiring distance, which may cause a defect such as a short circuit between wirings.

A wiring substrate according to an embodiment of the present invention includes: an insulating layer that contains multiple granular filler particles; and an embedded wiring layer that fills grooves formed on one of opposing surfaces in a thickness direction of the insulating layer. An inter-wiring distance between closest wirings in the embedded wiring layer is 2 µm or more and 8 µm or less, and a maximum particle size of the multiple filler particles is 50% or less of the inter-wiring distance.

A method for manufacturing a wiring substrate according to an embodiment of the present invention includes: forming an insulating layer containing multiple granular filler particles; and forming an embedded wiring layer in the insulating layer. The forming of the embedded wiring layer includes: forming grooves in the insulating layer; forming a metal film layer that covers inner surfaces of the grooves; and forming a plating film layer on the metal film layer. The forming of the grooves is performed such that a distance between closest grooves is 2 µm or more and 8 µm or less. The insulating layer is formed using a resin containing the multiple filler particles having a maximum particle size of 50% or less of the distance.

According to an embodiment of the present invention, a wiring substrate and a method for manufacturing a wiring substrate are provided that allow a high insulation reliability between wirings in an embedded wiring layer to be realized and allow a defect such as a short circuit between the wirings to be suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
    an insulating layer comprising resin and filler particles; and
    an embedded wiring layer comprising a plurality of wirings and embedded in the insulating layer such that the plurality of wirings is filling a plurality of grooves formed on a surface of the insulating layer, respectively, and that the filler particles include exposed filler particles exposed on inner surfaces of the grooves,
    wherein the embedded wiring layer is formed such that an inter-wiring distance between closest two wirings of the wirings in the embedded wiring layer is in a range of 2 µm to 8 µm, that the closest two wirings are formed in respective ones of the grooves and that the inner surfaces of the respective ones of the grooves have the exposed filler particles and are facing each other across a portion of the insulating layer, and the insulating layer is formed such that a maximum particle size of the filler particles is 50% or less of the inter-wiring distance, and the embedded wiring layer includes a metal film layer and a plating film layer formed on the metal film layer such that the metal film layer is covering the inner surfaces of the grooves and the exposed filler particles exposed on the inner surfaces of the grooves.

2. The wiring substrate according to claim 1, wherein the insulating layer is formed such that a content rate of the filler particles in the insulating layer is in a range of 25 weight % to 70 weight %.

3. The wiring substrate according to claim 1, wherein the embedded wiring layer includes the metal film layer comprising an electroless plating film layer and the plating film layer comprising an electrolytic plating film layer.

4. The wiring substrate according to claim 1, wherein the embedded wiring layer includes a finest pattern having a line/space of 5 μm/5 μm, and the insulating layer is formed such that the maximum particle size of the filler particles is 1 μm.

5. The wiring substrate according to claim 1, further comprising:
a conductor layer on which the insulating layer is formed such that the conductor layer is on an opposite side with respect to the embedded wiring layer,
wherein the insulating layer is formed such that the maximum particle size of the filler particles is 25% or less of a closest distance between the embedded wiring layer and the conductor layer.

6. The wiring substrate according to claim 1, wherein the insulating layer is formed such that the filler particles include filler particles having particle sizes of 25% or greater of the inter-wiring distance at a ratio of 75% or less of the insulating layer.

7. The wiring substrate according to claim 2, wherein the embedded wiring layer includes the metal film layer comprising an electroless plating film layer and the plating film layer comprising an electrolytic plating film layer.

8. The wiring substrate according to claim 2, wherein the embedded wiring layer includes a finest pattern having a line/space of 5 μm/5 μm, and the insulating layer is formed such that the maximum particle size of the filler particles is 1 μm.

9. The wiring substrate according to claim 2, further comprising:
a conductor layer on which the insulating layer is formed such that the conductor layer is on an opposite side with respect to the embedded wiring layer,
wherein the insulating layer is formed such that the maximum particle size of the filler particles is 25% or less of a closest distance between the embedded wiring layer and the conductor layer.

10. The wiring substrate according to claim 2, wherein the insulating layer is formed such that the filler particles include filler particles having particle sizes of 25% or greater of the inter-wiring distance at a ratio of 75% or less of the insulating layer.

11. The wiring substrate according to claim 3, wherein the embedded wiring layer includes a finest pattern having a line/space of 5 μm/5 μm, and the insulating layer is formed such that the maximum particle size of the filler particles is 1 μm.

12. The wiring substrate according to claim 3, further comprising:
a conductor layer on which the insulating layer is formed such that the conductor layer is on an opposite side with respect to the embedded wiring layer,
wherein the insulating layer is formed such that the maximum particle size of the filler particles is 25% or less of a closest distance between the embedded wiring layer and the conductor layer.

13. The wiring substrate according to claim 3, wherein the insulating layer is formed such that the filler particles include filler particles having particle sizes of 25% or greater of the inter-wiring distance at a ratio of 75% or less of the insulating layer.

14. The wiring substrate according to claim 4, further comprising:
a conductor layer on which the insulating layer is formed such that the conductor layer is on an opposite side with respect to the embedded wiring layer,
wherein the insulating layer is formed such that the maximum particle size of the filler particles is 25% or less of a closest distance between the embedded wiring layer and the conductor layer.

15. The wiring substrate according to claim 4, wherein the insulating layer is formed such that the filler particles include filler particles having particle sizes of 25% or greater of the inter-wiring distance at a ratio of 75% or less of the insulating layer.

16. The wiring substrate according to claim 5, wherein the insulating layer is formed such that the filler particles include filler particles having particle sizes of 25% or greater of the inter-wiring distance at a ratio of 75% or less of the insulating layer.

17. The wiring substrate according to claim 7, wherein the embedded wiring layer includes a finest pattern having a line/space of 5 μm/5 μm, and the insulating layer is formed such that the maximum particle size of the filler particles is 1 μm.

18. The wiring substrate according to claim 7, further comprising:
a conductor layer on which the insulating layer is formed such that the conductor layer is on an opposite side with respect to the embedded wiring layer,
wherein the insulating layer is formed such that the maximum particle size of the filler particles is 25% or less of a closest distance between the embedded wiring layer and the conductor layer.

19. A method for manufacturing a wiring substrate, comprising:
forming an insulating layer comprising resin and filler particles; and
forming an embedded wiring layer comprising a plurality of wirings in the insulating layer such that the embedded wiring layer is embedded in the insulating layer and that the plurality of wirings is filling a plurality of grooves formed on a surface of the insulating layer, respectively,
wherein the forming of the embedded wiring layer includes forming the plurality of grooves in the insulating layer such that an inter-wiring distance between closest two grooves of the grooves is set in a range of 2 μm to 8 μm, that the filler particles include exposed filler particles exposed on inner surfaces of the grooves, that the closest two wirings are formed in respective ones of the grooves and that the inner surfaces of the respective ones of the grooves have the exposed filler particles and are facing each other across a portion of the insulating layer, forming a metal film layer covering the inner surfaces of the grooves and the exposed filler particles exposed on the inner surfaces of the grooves, and forming a plating film layer on the metal film layer, and the forming of the insulating layer includes setting a maximum particle size of the filler particles to 50% or less of the inter-wiring distance between the closest two grooves of the grooves.

20. The method for manufacturing a wiring substrate according to claim 19, wherein the forming of the resin layer includes setting a content rate of the filler particles to a range of 25 weight % to 70 weight %.

\* \* \* \* \*